United States Patent [19]

Esquivel et al.

[11] Patent Number: 5,045,490

[45] Date of Patent: Sep. 3, 1991

[54] METHOD OF MAKING A PLEATED FLOATING GATE TRENCH EPROM

[75] Inventors: Agerico L. Esquivel, Dallas; Allan T. Mitchell, Garland; Howard L. Tigelaar, Allen, all of Tex.

[73] Assignee: Texas Instruments Incorporated, Dallas, Tex.

[21] Appl. No.: 570,655

[22] Filed: Aug. 21, 1990

Related U.S. Application Data

[62] Division of Ser. No. 469,814, Jan. 23, 1990, Pat. No. 4,979,004.

[51] Int. Cl.[5] .......................................... H01L 21/265
[52] U.S. Cl. ....................................... 437/43; 437/40; 437/41; 437/48; 437/49; 437/50; 437/52; 437/195
[58] Field of Search ..................... 437/40, 41, 43, 48, 437/49, 50, 52, 195

[56] References Cited

U.S. PATENT DOCUMENTS

| | | | |
|---|---|---|---|
| 4,163,988 | 8/1979 | Yeh et al. | 357/55 |
| 4,169,291 | 9/1979 | Rössler | 365/185 |
| 4,199,772 | 4/1980 | Natori et al. | 357/23 |
| 4,222,062 | 9/1980 | Trotter et al. | 357/45 |
| 4,222,063 | 9/1980 | Rodgers | 357/45 |
| 4,364,074 | 12/1982 | Garnache et al. | 357/23 |
| 4,542,396 | 9/1985 | Schutten | 357/23.4 |
| 4,590,504 | 5/1986 | Guterman | 357/23 |
| 4,698,900 | 10/1987 | Esquivel | 437/52 |
| 4,713,677 | 12/1987 | Tigelaar et al. | 357/23.5 |
| 4,763,177 | 8/1988 | Paterson | 357/23.5 |
| 4,774,556 | 9/1988 | Fujii et al. | 357/23.5 |
| 4,814,840 | 3/1989 | Kameda | 357/23.5 |
| 4,892,840 | 1/1990 | Esquivel et al. | 437/52 |
| 4,975,383 | 12/1990 | Baglee | 437/52 |
| 4,975,384 | 12/1990 | Baglee | 437/52 |
| 4,979,004 | 12/1990 | Esquivel et al. | 357/55 |

FOREIGN PATENT DOCUMENTS

| | | | |
|---|---|---|---|
| 118981 | 10/1978 | Japan . | |
| 126973 | 10/1981 | Japan . | |
| 061188 | 4/1984 | Japan . | |
| 078576 | 5/1984 | Japan . | |
| 154071 | 9/1984 | Japan . | |
| 144879 | 7/1986 | Japan | 357/23.5 |
| 0721171 | 4/1987 | Japan | 357/23.5 |
| 2069757 | 8/1981 | United Kingdom | 437/48 |

OTHER PUBLICATIONS

IBM Technical Disclosure Bulletin, vol. 24 #3, pp. 1331-1333, by Tsang.
IEEE Electron Device Letters, vol. EDL-8 #4, pp. 146-147, by Esquivel et al.

Primary Examiner—Brian E. Hearn
Assistant Examiner—Gordon V. Hugo
Attorney, Agent, or Firm—Stanton C. Braden; James T. Comfort; Melvin Sharp

[57] ABSTRACT

One embodiment of the invention provides an EPROM and a method of fabricating an EPROM with enhanced capacitive coupling. Trenched memory cells each comprise a pleat-shaped floating gate with the control gate nested in a fold of the floating gate to increase the coupling ratio with the control gate. As a result higher programming speed and improved cell density may be obtained for a given programming voltage. Formation of bit lines along trench walls results in lower bit lines resistivity for a given cell density.

6 Claims, 16 Drawing Sheets

METHOD OF MAKING A PLEATED FLOATING GATE TRENCH EPROM

This is a division of application Ser. No. 07/469,814, filed 1/23/90, now U.S. Pat. No. 4,979,004.

FIELD OF THE INVENTION

The present invention relates to memory cells and, in one form, more particularly to floating gate memory cells such as the type used in Erasable Programmable Read Only Memory (EPROM) devices and Electrically Eraseable Programmable Read Only Memory (EEPROM) devices.

BACKGROUND OF THE INVENTION

Recent innovations in the design of nonvolatile memory cell arrays, such as bit line isolation by trenching, disclosed in U.S. Pat. No. 4,698,900, "Method of Making a Non-Volatile Memory Having Dielectric Filled Trenches" assigned to a common assignee, reduce current leakage and punch through to the point where individual cell sizes on the order of 13 square microns are achievable. The decreases in cell size which are necessary for fabricating higher density memory devices, e.g., greater than 1 megabit, also require significant reductions in programming voltages. Prior efforts to achieve these higher cell densities have required scale reductions in the cross sectional areas of bit lines. These reductions are known to result in increased bit line resistance, which, in turn, require more ohmic contacts to limit voltage losses. A greater number of contacts will increase the size of the array, in part cancelling out the effectiveness of the smaller cell size.

A need also exists for a floating gate memory cell which may be more rapidly and reliably programmed with a relatively low operating voltage. For example, even though the programming time of some prior art nonvolatile memory arrays is reasonably fast, such designs are known to achieve much less than 100% programmation per pass. If 90% of the cells were to program successfully on each pass, then a megabit memory would be expected to require six programming cycles to complete programming. It is desirable to reduce multiple program/read/reprogram cycles (known as "bit-banging") in order to fully program megabit and higher density memory devices at faster rates. An associated need exists for a fabrication method and process for forming such an improved memory device based upon well-known silicon technology.

SUMMARY OF THE INVENTION

In accordance with one embodiment of the invention a nonvolatile semiconductor memory device is provided wherein a plurality of trenched memory cells are arranged in an array along the surface of a semiconductor structure. Each memory cell comprises a source region, a drain region, a floating gate, a control gate and a dielectric layer isolating the control gate from the floating gate. The floating gate and the control gate of each memory cell are formed in a pleat shape, i.e., having one or more folds, within a trench. The control gates in each row of cells are connected to a row address line and each row address line is connected to a row decoder. All of the source and drain electrodes are electrically connected to form column lines and the source and drain column lines are connected at each end to a column decoder.

An inventive method is provided for fabricating the novel device. First, a trench is formed beneath a horizontal substrate surface, the trench having at least two walls preferably separated by a bottom portion. A memory cell having a pleated floating gate is then formed in the trench.

In one embodiment the trench is n+ doped and the dopant is diffused to form source and drain electrodes along the trench walls. The bottom portion is then etched to remove n+ substrate. Next, a dielectric layer is thermally grown along the trench walls and bottom portion. Subsequently, a pleat-shaped floating gate is layered over the thermal oxide and an interlevel dielectric is formed over the floating gate. Then a control gate is deposited along the pleat-shaped floating gate.

In an alternate embodiment of the invention a nonvolatile semiconductor memory device comprises a plurality of floating gate memory cells each formed about first and second adjacent trenches on a substrate surface. A partition along the surface defines a first wall in the first trench and a second wall in the second trench. A source electrode is formed along the first wall of the first trench and a drain electrode is formed along the second wall of the second trench with a conduction channel resulting between the source and drain electrodes along an upper surface of the partition. A floating gate having at least one pleat is draped about the substrate, the floating gate substantially enveloping the electrodes and the conduction channel. A first insulative layer is interposed between the floating gate and the partition to prevent current flow between the floating gate and the electrodes and to prevent current flow between the floating gate and the conduction channel. A control gate is positioned over the floating gate, extending from the first trench to the second trench, with a second insulative layer positioned therebetween to prevent current flow between the control gate and the floating gate.

A novel method for fabricating a memory cell of the alternate embodiment of the invention begins with etching at least first and second trenches over a substrate surface, the trenches each having first and second walls and, preferably, a bottom portion, there resulting a partition between the two trenches extending along the substrate surface, the partition defining the first wall in the first trench and the first wall in the second trench. Next, a memory cell having a pleat-shaped floating gate, i.e., having one or more folds, is formed about the partition so that the floating gate extends into each trench. In one form of this method dopant of a first conductivity type is deposited and diffused into the trenches to form source and drain electrodes along the first walls and a bit line along each trench bottom portion so that the source and drain electrodes are each electrically connected to a different bit line. A high quality gate oxide is then formed over the partition. Simultaneous oxidation along the surfaces of the source and drain electrodes provides an insulative layer to electrically isolate the floating gate. Next a first layer of doped polycrystalline semiconductor material is formed about the partition, substantially enveloping the electrodes.

This first layer is pattern blocked and selectively etched to preserve polycrystalline material in the form of a floating gate having a pleat draped about the substrate partition. The pattern block is then removed and an interlevel oxide/nitride layer is deposited over the entire exposed surface. A second layer of polycrystalline material is then deposited over the entire surface, completely filling the trenches. The second layer is selectively etched along the substrate surface and the trenches to form an isolated row line comprising a control gate positioned over the floating gate. The exposed portions of the trenches and the substrate surface are then coated with oxide and etched back to form a planar surface.

It is an object of the present invention to provide a nonvolatile high density memory device which, for a given applied voltage between the control gate and the source and drain electrodes, has improved capacitive coupling between the control gate and the floating gate, this feature allowing for a faster rate of memory cell programmation.

It is a further object of the present invention to provide a nonvolatile high density memory device having improved reliability in programmation so that for a given programming speed and cell density there results a reduction in the number of program/read/reprogram cycles needed to fully program the device.

It is still another object of the present invention to provide a memory device wherein the bit lines are formed along the trench walls and bottom portions so that reductions in cell size do not require reductions in the cross sectional area of the bit lines.

A corresponding advantage of the present invention is the improved conductivity of bit lines for a given cell density, this improvement necessitating fewer ohmic contacts to control voltage losses.

BRIEF DESCRIPTION OF THE DRAWINGS

The invention may best be understood by reference to the following detailed description of illustrative embodiments when read in conjunction with the accompanying drawings, wherein.

DETAILED DESCRIPTION OF THE INVENTION

Although specific embodiments of the invention are described herein with reference to an NMOS EPROM, it is to be understood that the invention is generally applicable to nonvolatile floating gate memory devices, e.g., EPROMS, EEPROMS, and EAROMS. It should also be understood that while particular means are described herein for forming electrical connections between device components and for programming memory devices, many variations, depending on the device type, will be apparent to those skilled in the art.

Figure 1:
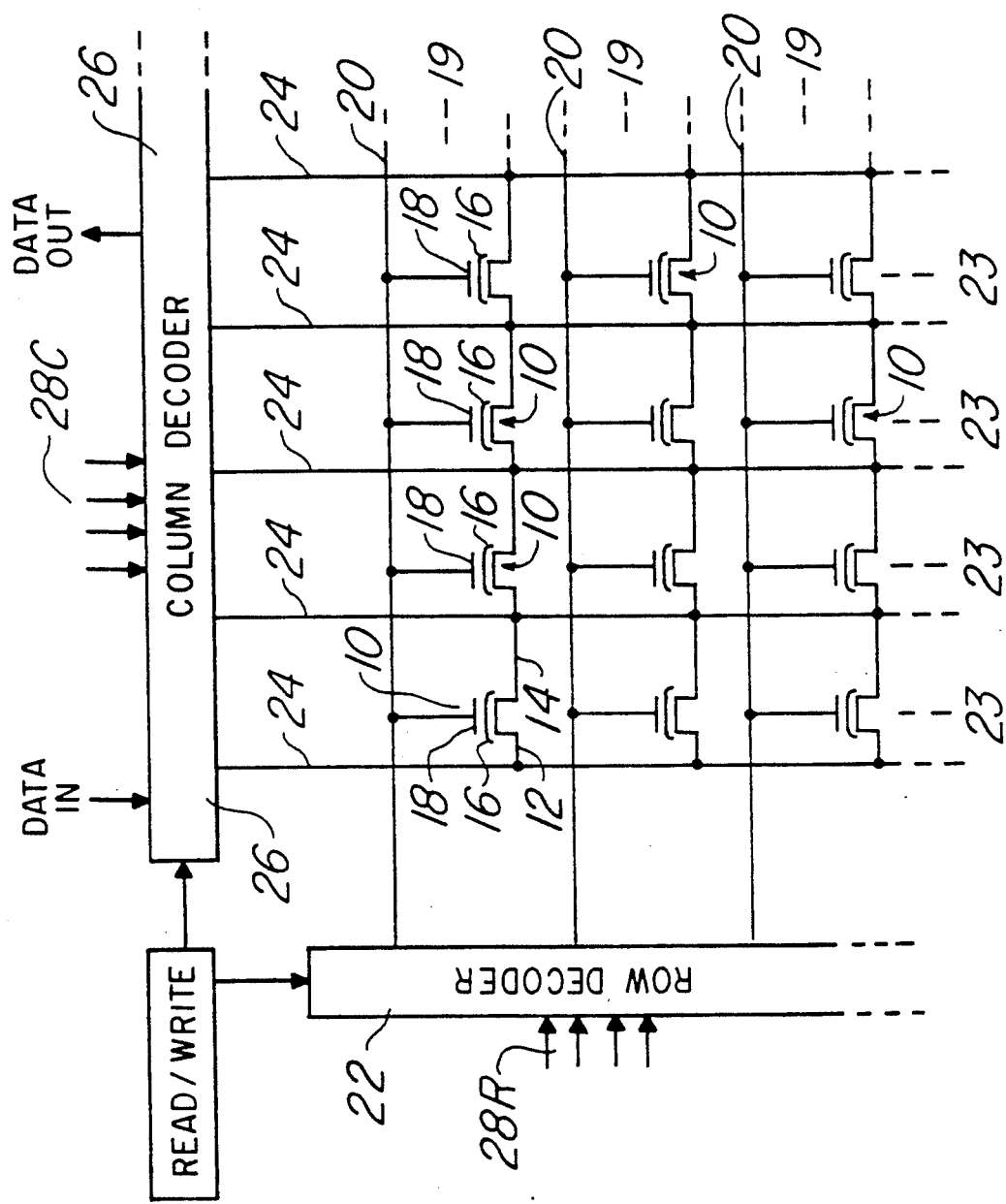
FIG. 1 illustrates in schematic form a partial view of a floating gate EPROM device constructed according to the present invention.

Referring first to FIG. 1, there is illustrated in schematic form a partial view of an array of floating gate memory cells 10 arranged to form a high density, e.g., 1 megabit, memory device. Each cell 10 comprises a field effect transistor having a source 12, a drain 14, a pleated floating gate 16 and a control gate 18. Each of the control gates 18 in a row 19 of cells is connected to a row address line 20 and each of the row address lines is connected to a row decoder 22. Each source or drain electrode 12 or 14 in a column 23 of cells is connected to a column line 24 and the source and drain column lines 24 are connected to a column decoder 26.

In a write or program mode, the column decoder functions to apply either a relatively high voltage, e.g., between 10 and 12 volts, or a low voltage, e.g., ground potential, selectively to each source and drain column line 24 in response to both a column address on lines 28C and a binary data input. Also during a write or program operation the row decoder applies either a high voltage or a low voltage to each of the row lines 20 in response to a row address on lines 28R. In the read mode the column decoder 26 grounds the line 24 to the right of a selected cell and connects a static load to the column line to the left of the selected cell. The row decoder 22 applies a logic "1" voltage to the selected row line and a logic "0" voltage to all other row lines 20.

Figure 2:
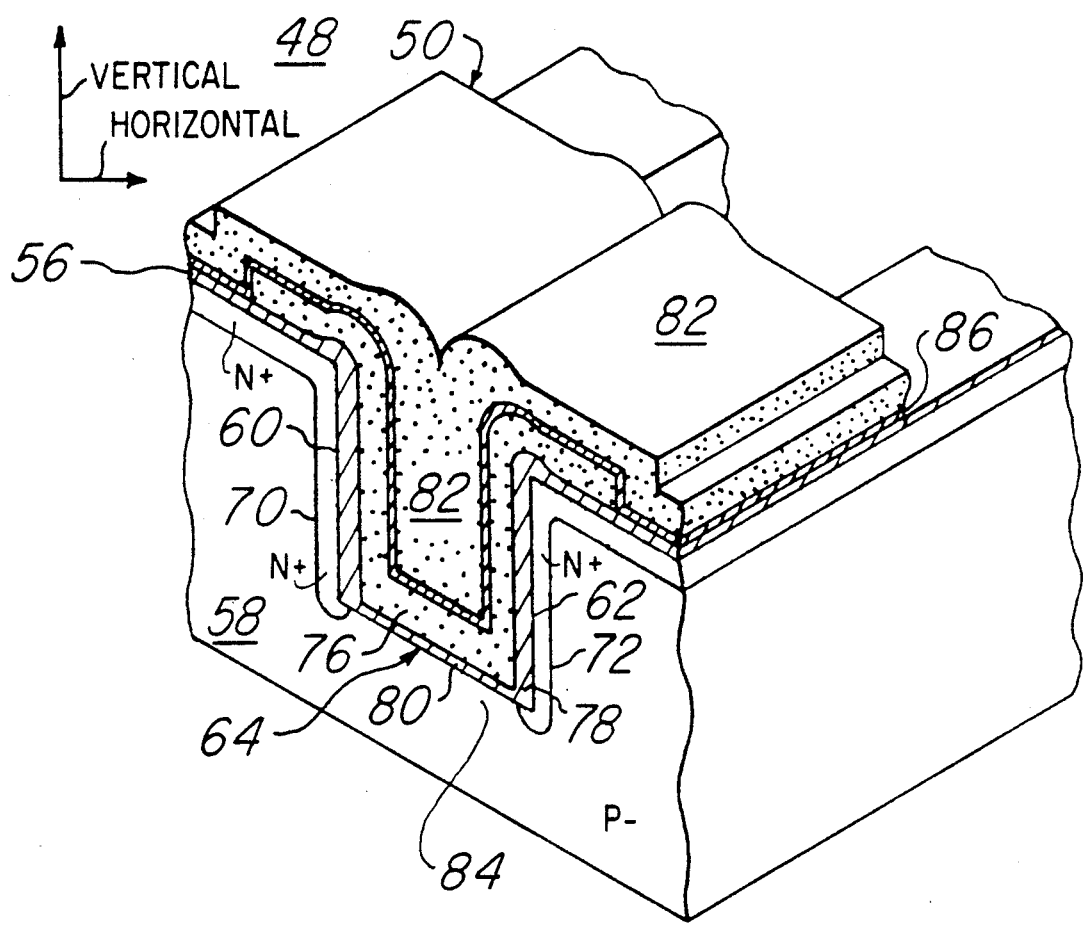
FIG. 2 is a cut-away perspective view of a nonvolatile memory cell incorporating the features of the present invention.

A specific embodiment of the novel cell 10 is illustrated in the enlarged partial perspective view of an EPROM device 48 shown in FIG. 2. A floating gate EPROM cell 50 is formed within a rectangular shaped trench beneath the horizontal surface 56 of a lightly p-doped silicon substrate 58. The trench includes two opposing side wall portions 60 and 62 separated from one another by a horizontal bottom portion 64. A pair of n+ doped source and drain electrodes 70 and 72 are formed within the trench, each along mutually opposing trench side wall portions 60 and 62. The electrodes may be formed as parts of adjacent column or bit lines according to the schematic illustration of FIG. 1 to create an array of cells 50.

The inventive memory cell 50 further comprises a pleat shaped floating gate 76 which lines the trench. As illustrated, the floating gate has one fold. However, a pleated floating gate may have multiple folds. A first dielectric layer 78, e.g., silicon oxide, isolates the floating gate 76 from the electrodes 70 and 72 and a second dielectric layer 80, e.g., a high quality gate oxide such as a thermally grown silicon oxide, is interposed between the floating gate 76 and the trench bottom portion 64. The control gate 82, also formed of polycrystalline silicon, is layered within the pleated floating gate 76 so that substrate immediately beneath the gate oxide 80 may be controlled to provide a conduction channel 84. A third dielectric layer 86 is formed between the floating gate 76 and the control gate 82. The control gate 82 extends out of the trench along the substrate surface 56 to form a portion of a row line 20 as indicated schematically in FIG. 1.

While the cell 50 operates according to the same principals by which conventional EPROM cells function, it programs faster than a conventional cell. This and other benefits, e.g., lower programming voltage for a given cell density, result from enhanced capacitive coupling. That is, the ratio of the coupling from the control gate to the floating gate to the coupling from the floating gate to the substrate is increased. Because the control gate is layered within the novel pleat-shaped floating gate structure taught by the present invention, the available surface area for coupling charge between the control gate and the floating gate is increased.

In comparison to conventional cell designs, application of a given programming voltage to the control gate 82 will result in a stronger electric field between the floating gate 76 and the substrate 58. Thus, the level of electron injection from the conduction channel into the floating gate is enhanced.

Coupling ratios for conventional design floating gate memory cells have been calculated in the past based on the ratio of measured gate voltages. See, for example, Esquivel et al., "A Novel Trench-Isolated, Buried N+ FAMOS Transistor Suitable For High Density EPROMS", *Electron Device Letters*, Vol. EDL-8, No. Apr. 4, 1987, pp. 146-147. Coupling ratios for conventional design memory cells are known to range from 0.4 to 0.625.

Figure 3:
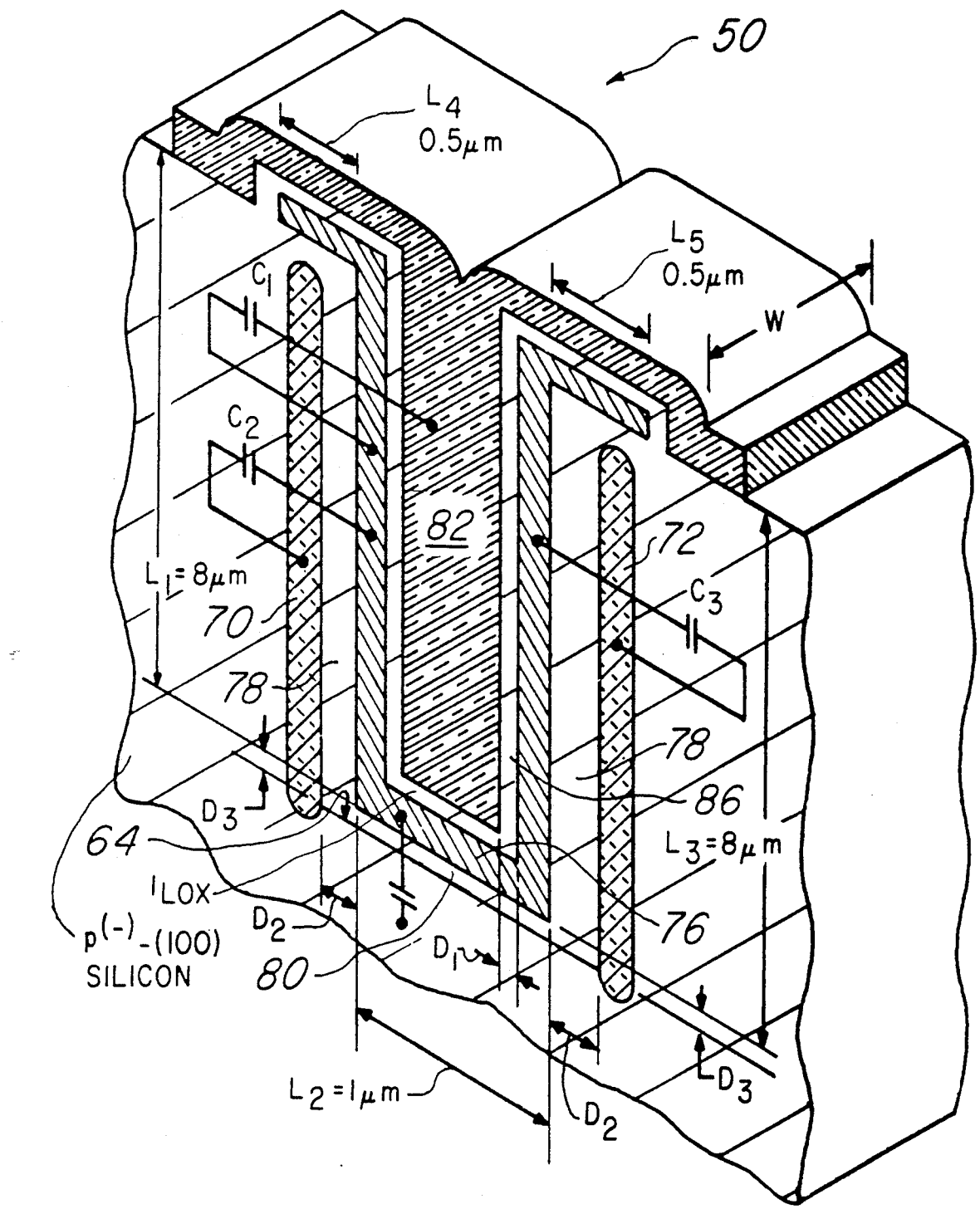
FIG. 3 illustrates exemplary geometric and electrical parameters for the EPROM cell of FIG. 2.

The advantages of the new design may be demonstrated by comparing the range of coupling ratios for conventional designs with the coupling ratio for one embodiment of the inventive cell 50. By way of example, FIG. 3 illustrates relevant dimensions for computing the theoretical coupling ratio for the memory cell 50 of FIG. 2 wherein the floating gate 76 is characterized by a width W and a pleated length L draped across the trench.

The length L is approximated by summing straight line segments wherein:

$$L = L_1 + L_2 + L_3 + L_4 + L_5;$$

and $L_1$ and $L_3$ represent the depth of the trench measured along symmetric side wall portions 60 and 62;

$L_2$ represents the distance between the opposing portions of dielectric layer 78 which isolate the floating gate 76 from the electrodes 70 and 72; and $L_4$ and $L_5$ each represent lengths of the floating gate extending along the substrate surface.

The capacitive coupling ratio is defined by:

$$K = \frac{C_1}{C_1 + C_T} = \frac{1}{1 + C_T/C_1}$$

where $$C_T = C_2 + C_3 + C_4$$

and where:

$C_1$ is the capacitance between the control gate and the floating gate;

$C_2$ and $C_3$ are the capacitances between the floating gate and the source and drain electrodes respectively; and $C_4$ is the capacitance between the floating gate and the conduction channel.

Letting $D_1$ be the thickness of the dielectric layer 86 between the floating gate 76 and the control gate 82, $D_2$ the thickness of portions of the dielectric layer 78 lying between the floating gate 76 and each of the source and drain electrodes 70 and 72, and $D_3$ the thickness of the gate oxide 80 as measured between the floating gate 76 and the trench bottom portion 64, and assuming equivalent permitivities for the dielectric layers $D_1$, $D_2$ and $D_3$, denoted by $E_{ox}$, then $$C_1 = \frac{E_{ox} W L}{D_1},$$

$$C_2 = C_3 = \frac{E_{ox} W L_1}{D_2}, \text{ and}$$

$$C_4 = \frac{E_{ox} W L_2}{D_3}.$$

For a cell size of 14 square microns,
L1 = 8 microns;
L2 = 1 micron;
L3 = 8 microns;
L4 = 0.5 micron;
L5 = 0.5 micron;
D1 = 333 Angstroms
D2 = 4000 Angstroms; and
D3 = 325 Angstroms.

Calculating the individual capacitances with Eox = 3.45 Fcm−1, the resulting coupling ratio K is 0.884, approximately forty percent greater than the coupling ratio for a conventional design EPROM.

Figure 4:
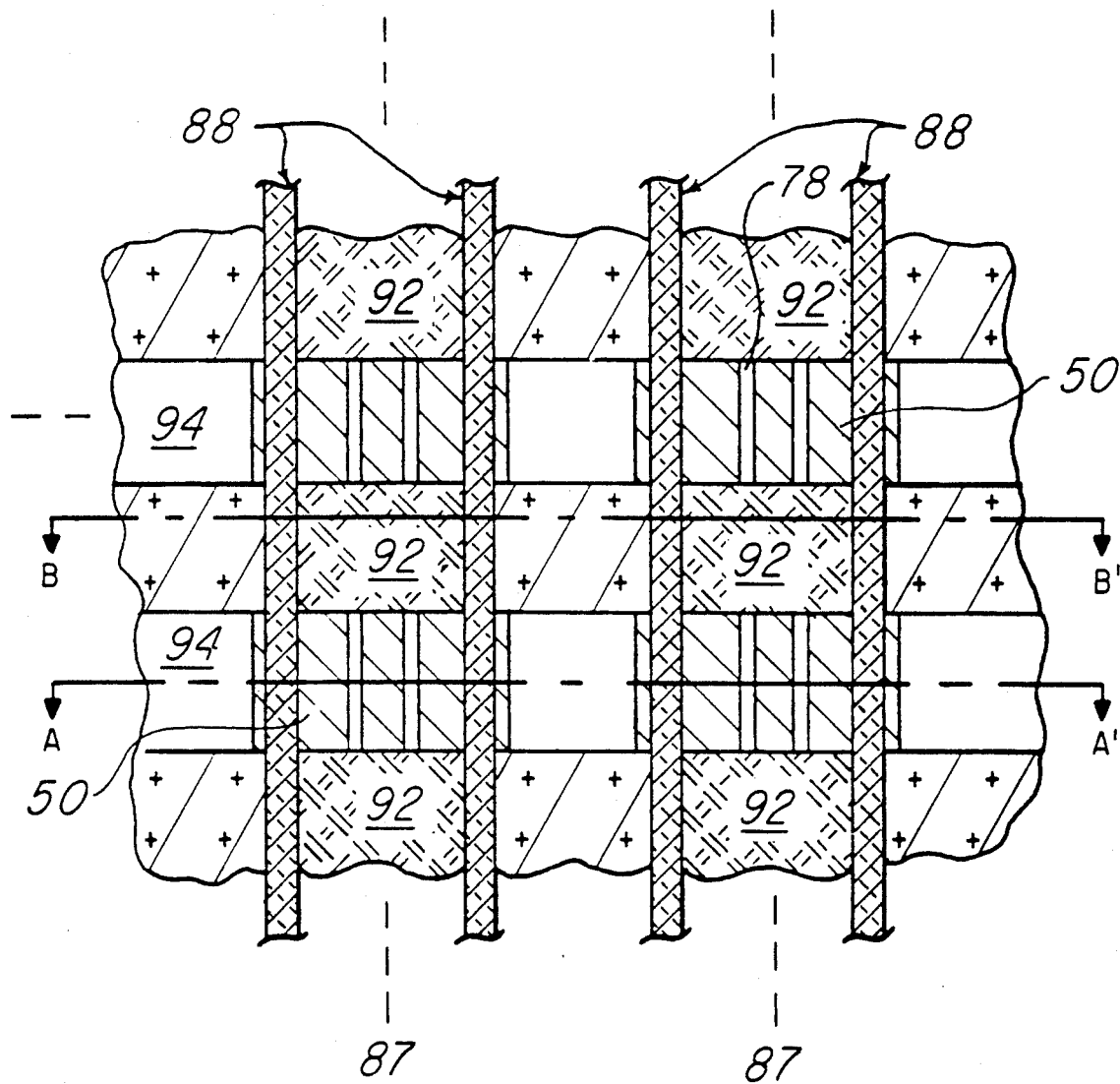
FIG. 4 is a cut-away partial plan view of an array of memory cells incorporating a bit line isolation technique according to the present invention.
Figure 5:
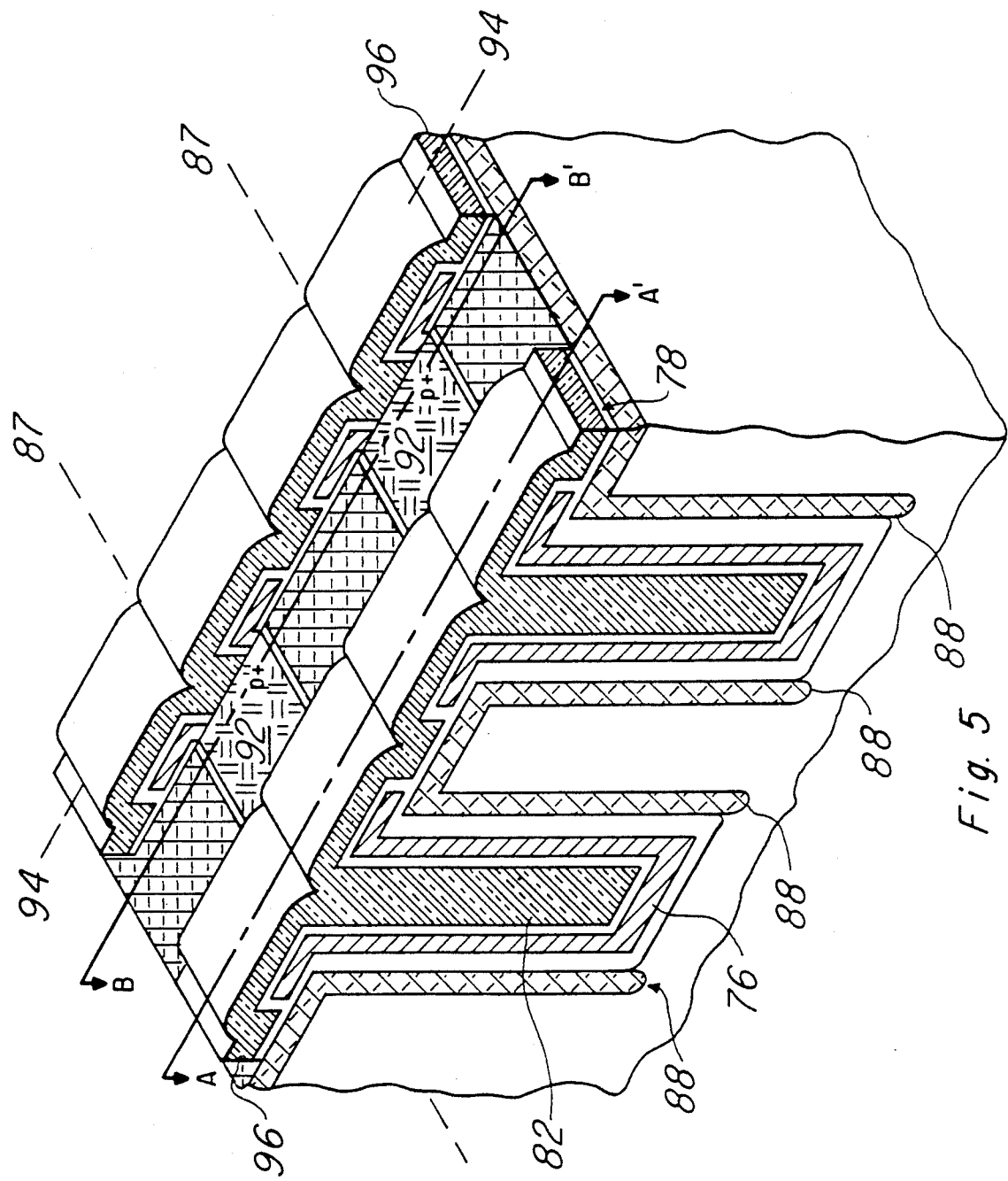
FIG. 5 is a cut-away partial perspective view of the device shown in FIG. 4.

Furthermore, an array of nonvolatile memory cells 50 formed according to the inventive design may also incorporate bit line isolation (as disclosed in U.S. Pat. No. 4,698,900, herein incorporated by reference), to further enhance the capacitive coupling ratio. FIGS. 4 and 5, which are cut-away plan and side partial perspective views of an array of cells 50, illustrate bit line isolation as a means for obtaining a further reduction in parasitic capacitance. Respective source and drain electrodes associated with each cell 50 in a column 87 are connected with source and drain electrodes of other cells 50 in the same column 87 to form bit lines 88 which correspond to column lines 24 in FIG. 1.

Bit line isolation is achieved either by ion implantation or trench isolation in the regions 92 which lie along columns 87 between bit lines 88 and between adjacent rows 94 of cells 50. Bit line isolation, whether by ion implantation or by trenching below the bit lines, also provides improvements in bitline to bitline punch through voltage.

According to the present invention the process for fabricating a device comprising a dense array of memory cells 50 is illustrated in FIGS. 6a-6e and FIGS. 7a-7e. With reference to lines A—A' and B—B' shown in FIGS. 4 and 5, FIGS. 6 present, in a cross sectional view taken along line A—A', the fabrication sequence for an individual cell 50 formed in a trench. FIGS. 7 present the fabrication sequence adjacent the cell 50 in a cross sectional view taken along line B—B'. Although the method is now specifically illustrated for fabricating a single cell, it is to be understood that in preferred embodiments of the invention an array of cells is formed along a plurality of parallel trenches on the substrate surface 56. See FIGS. 4 and 5. Each trench extends along a column 87 in order to form multiple rows and columns of cells 50, the control gates in each row 94 being connected to form a row line 96.

Figure 6A:
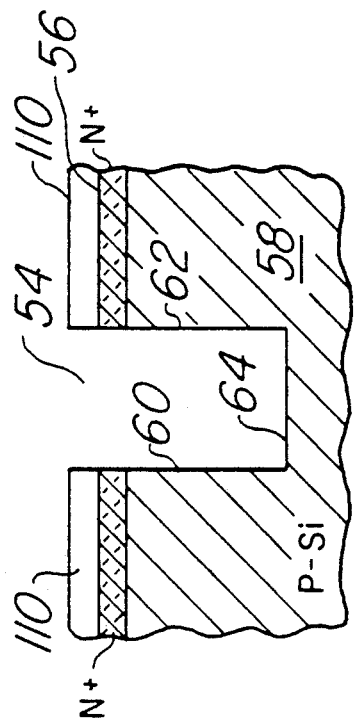
FIGS. 6a–6i present, in a partial cross sectional view taken along line A—A' shown in FIGS. 5 and 6, a fabrication sequence for the device.
Figure 7A:
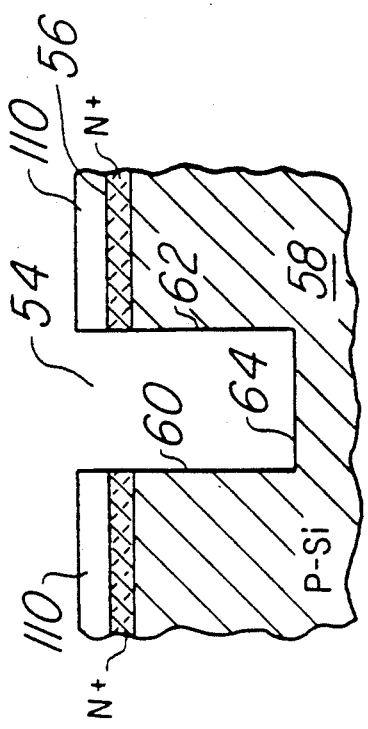
FIGS. 7a–7i present, in a cross sectional view taken along line B—B' shown in FIGS. 4 and 5, a fabrication sequence for the device.

In a preferred embodiment the starting material is a slice of p-type monocrystalline silicon cut to form a substrate 58 having a horizontal surface along the <100> plane. Initially, an N-type dopant is implanted in the area in which the EPROM cells will be constructed. As illustrated in FIGS. 6a and 7a an oxide mask 110 is patterned with photoresist over the surface 56 to define each trench. Trenches are then formed to a predetermined depth in the substrate 58 with a vertical silicon etch resulting in nearly vertical wall portions 60 and 62 and bottom portion 64.

As an alternative to vertical etching, other etchants may be used to form trenches having walls which are sloped with respect to the surface 56, this resulting in greater wall surface area for a given trench depth. Although this in turn could lead to larger surface areas for the floating gate 76, the control gate 82 and the bit lines 88, thereby providing enhanced capacitive coupling and lower resistance, the fabrication processes may be more complex and less desirable for manufacture.

Figure 6B:
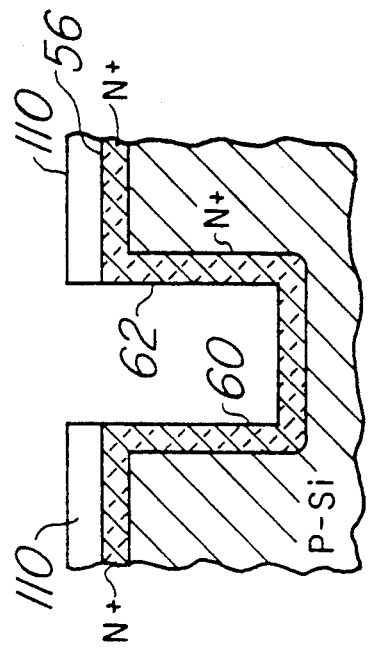
Figure 7B:
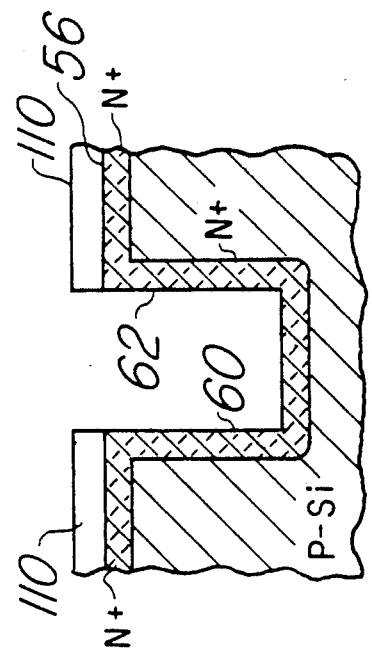
Figure 7C:
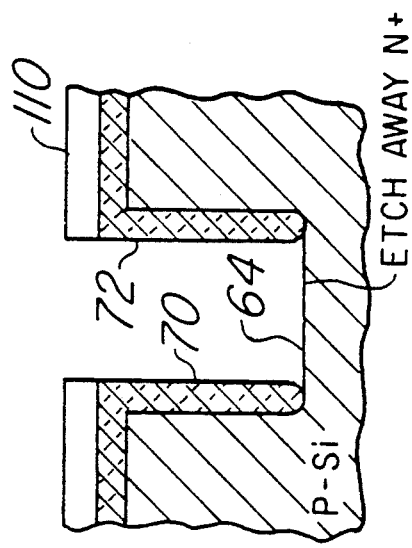
Figure 6C:
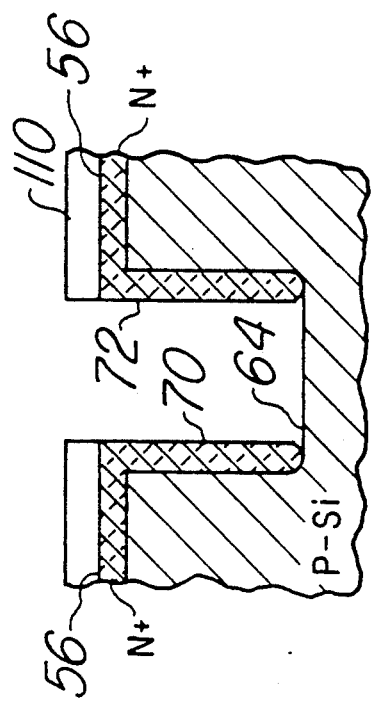

Once the trench is formed an n+ dopant, e.g., phosphorous, is deposited and diffused into the trench (FIGS. 6b and 7b). Then an anisotropic etch is applied to selectively remove diffused n+ dopant from the trench bottom portion 64 so that isolated source and drain electrodes 70 and 72 remain along the wall portions 60 and 62 (FIGS. 6c and 7c).

Figure 7D:
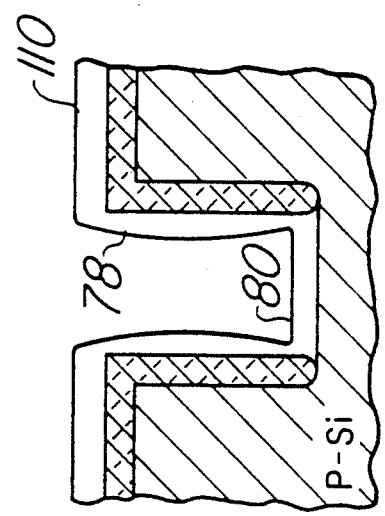
Figure 6D:
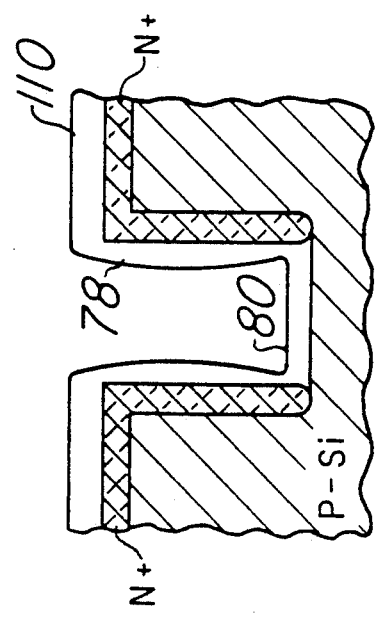

Next, as illustrated in FIGS. 6d and 7d, relatively thick dielectric layers 78 are formed on the wall portions 60 and 62 and on the substrate surface 56. A layer of relatively thin gate oxide 80 is formed on the trench bottom portion. The layers 78 may be thermally grown from the exposed surfaces of the electrodes while the gate oxide is simultaneously formed from substrate on the trench bottom portion. The presence of dopant along the exposed surfaces will accelerate oxide growth causing the dielectric layers 78 to be thicker (e.g., $D_2 = 4000$ Angstroms) than the gate oxide layer, (e.g., $D_3 = 325$ A). The layers 78 and the gate oxide 80 form a continuous dielectric lining along the trench interior.

Figure 7E:
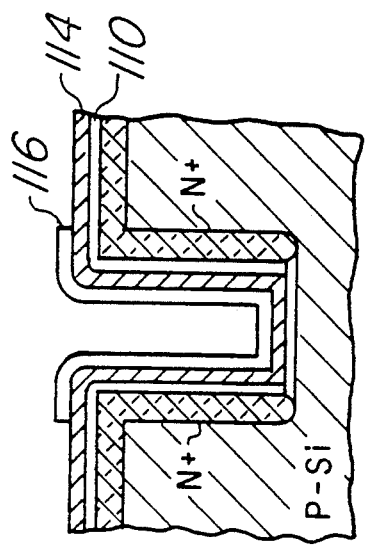
Figure 7F:
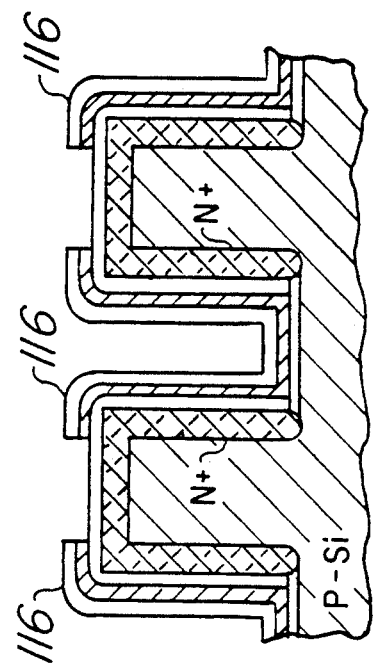
Figure 6E:
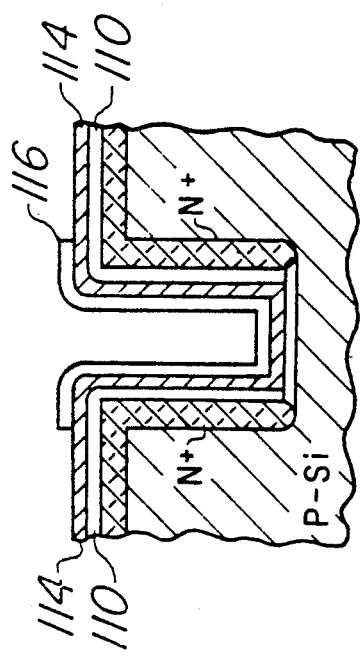
Figure 6F:
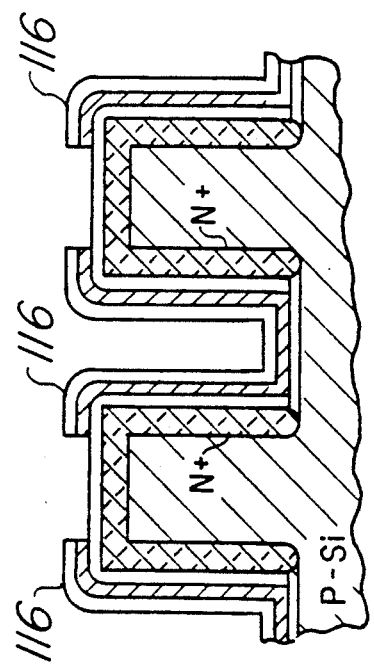

A first layer of doped polycrystalline semiconductor material 114 is now deposited (e.g., to 3000 Angstroms, $POCl_3$ doped) over the layers 78 and gate oxide 80. See FIGS. 6e and 7e. In order to form discrete pleat-shaped floating gates 76 along the trench contour, the first polycrystalline layer 114 is pattern blocked 116 and selectively etched to preserve polycrystalline material in the trench. (FIGS. 6f and 7f).

Next, in order to form the third dielectric layer 86, interlevel dielectric 118 is deposited over the entire surface, e.g., 250 Angstroms of oxide plus 150 Angstroms of nitride by low pressure chemical vapor deposition at 800 C. (FIGS. 6g and 7g) Alternatively, layer 86 may be formed by thermal oxidation along the polysilicon surface of the floating gate.

Figure 7G:
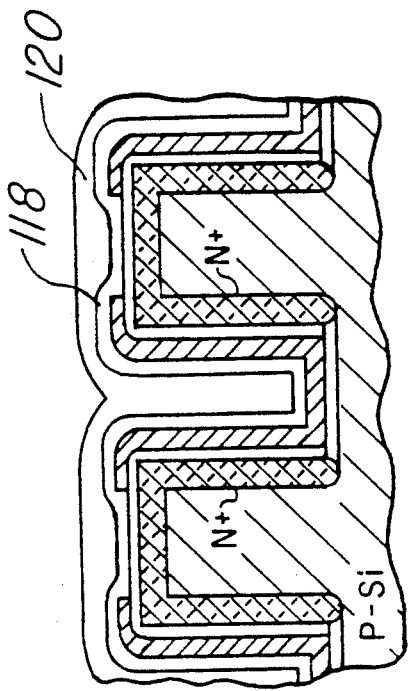
Figure 7H:
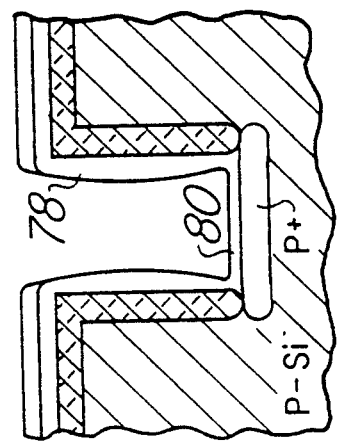
Figure 6G:
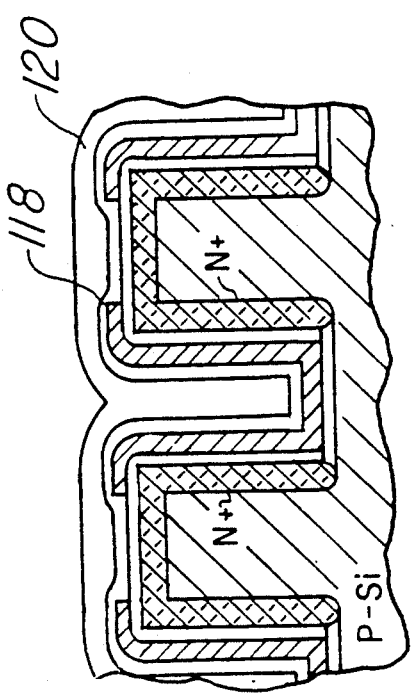
Figure 6H:
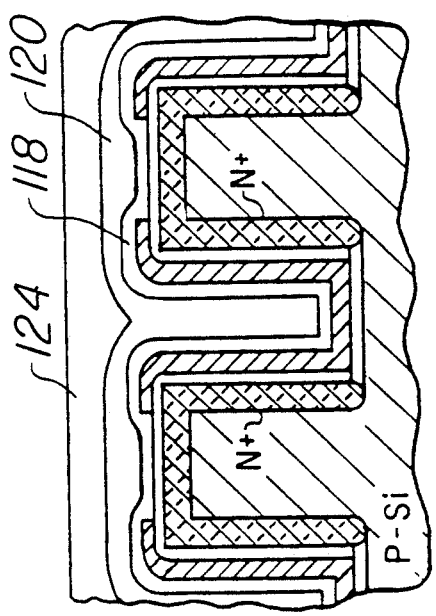

A second layer of doped polysilicon silicon 120 is then formed over the interlevel dielectric 118 filling the trench 54 and coating the entire surface. The second layer 120 is then masked with photoresist 124 along line A—A' (FIG. 6h) and an anisotropic poly etch, e.g., HCl/HBr, with high selectivity to oxide is applied to completely strip the second polycrystalline layer 120 without breaking through the interlevel dielectric. An isotropic oxide etch is then applied to the interlevel dielectric 118 from the surface of the first poly layer 114. Finally the anistropic poly etch with high selectivity to oxide is again applied to remove the first poly layer 114 along line B—B' (FIG. 7h).

The control gate 82, i.e., the remaining portion of polycrystalline layer 120, is positioned along line A—A' on the substrate surface 56 to form a portion of a row line 94 as illustrated in FIGS. 4 and 5. Next heavy p+ doping is performed by ion implantation over unmasked regions. The dopant penetrates the gate oxide 80 over regions 92 in order to isolate source and drain regions at the bottom of the trench from one another along line B—B'.

Figure 7I:
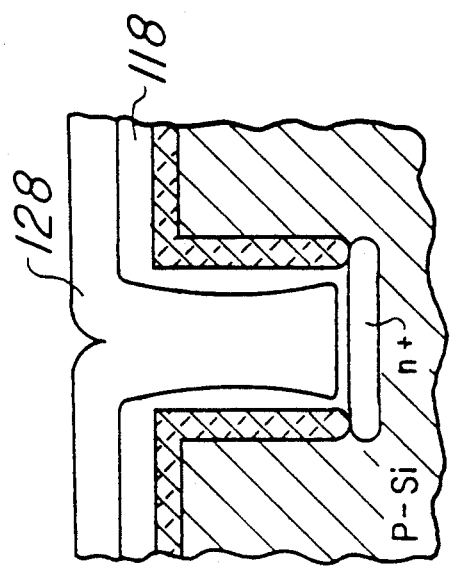
Figure 6I:
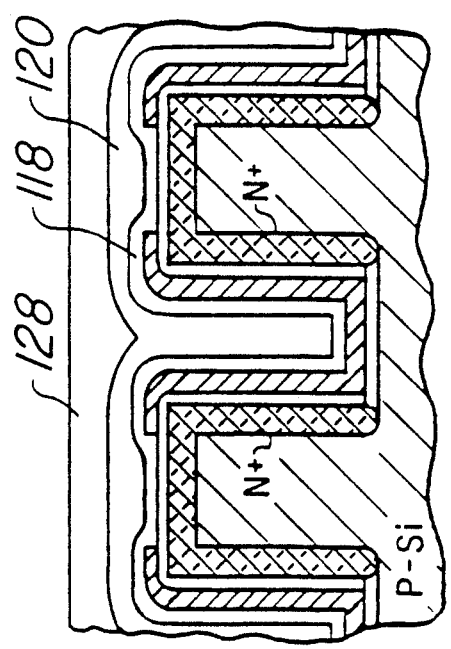

The mask 124 is then stripped away and the etched region along line B—B' is coated with an oxide layer 128 to fill the trench and cover the substrate surface 56 (FIGS. 6i and 7i). The oxide layer 128 may be etched back to reduce its thickness.

Figure 8:
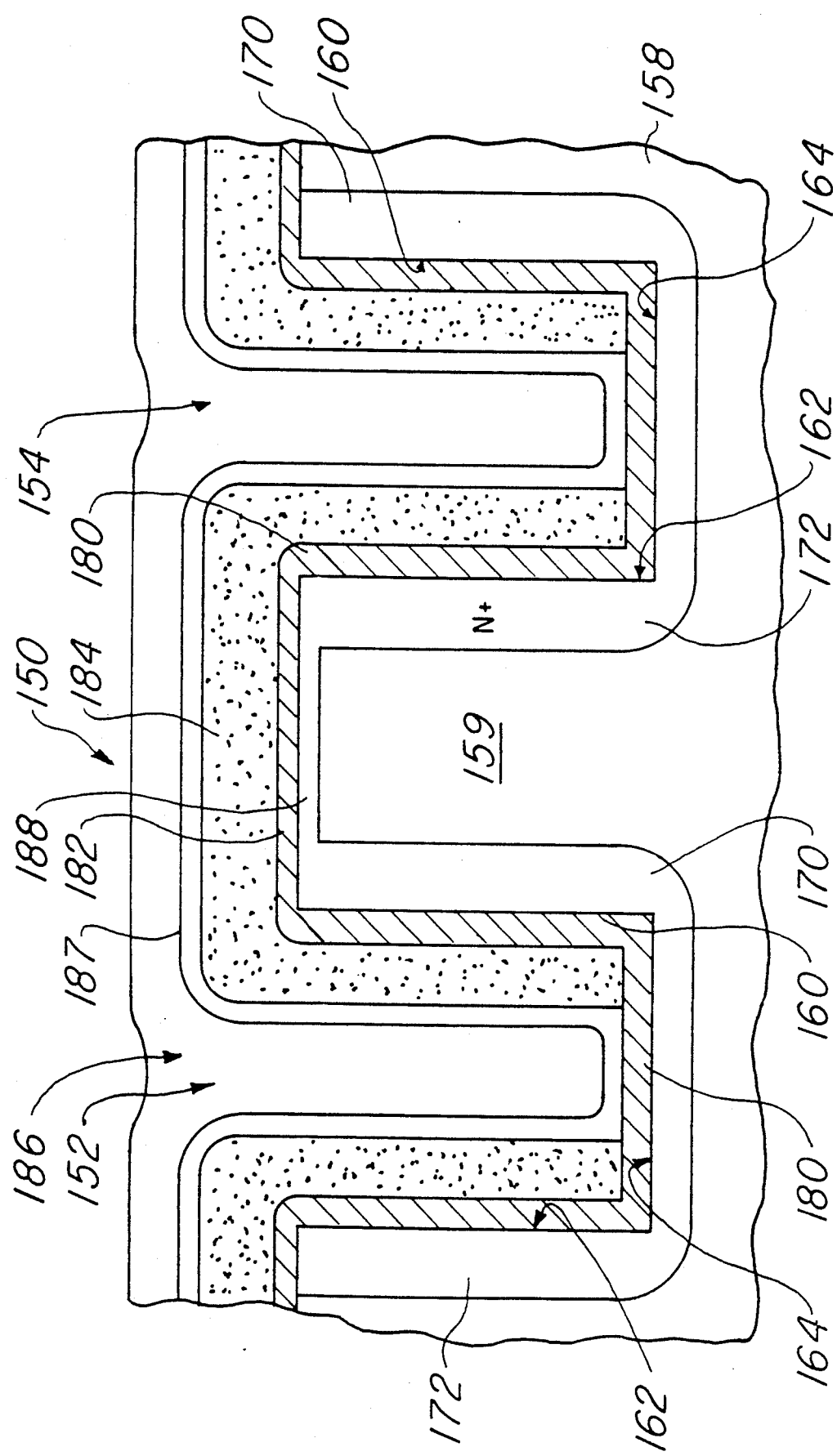
FIG. 8 is a cross sectional view of a floating gate EPROM cell constructed according to an alternate embodiment of the invention.

FIG. 8 illustrates in cross sectional view an alternate embodiment of the invention. A pleated floating gate memory cell 150 is formed about first and second adjacent trenches 152 and 154 along the surface of a lightly doped silicon substrate 158 of a first conductivity type. Each trench, separated by a partition 159, comprises mutually opposing first and second side wall portions 160 and 162 and a horizontal bottom portion 164. A pair of source and drain electrodes 170 and 172 of a second conductivity type are formed along the first and second wall portions 160 and 162 within each trench.

Referring also to FIG. 8, there is illustrated in a cutaway partial perspective view an array of cells 150 formed in columns and rows according to the illustration of FIG. 1 to form an EPROM device 173. Adjacent source and drain electrodes 170 and 172, formed in the same row and on opposing wall portions 160 and 162 of the same trench, are each associated with different cells in adjacent columns 174. Such adjacent electrodes formed along the same trench are electrically connected by a buried N+ diffusion along the entire trench bottom portion 164 to form bit lines 176 between adjacent pairs of columns 174.

The cells 150 further comprise a first dielectric layer 180 formed over the substrate 158. Layer 180 includes a high quality gate oxide 182 extending along the substrate surface from the source electrode 170 to the drain electrode 172. A polycrystalline silicon pleat shaped floating gate 184 is draped over the first dielectric layer 180. A control gate 186, also formed of polycrystalline silicon, is formed over the floating gate 184 with a second dielectric layer 187 interposed between the two gates 184 and 186. The composite structure results in a conduction channel 188 immediately beneath the gate oxide 182.

Figure 9:
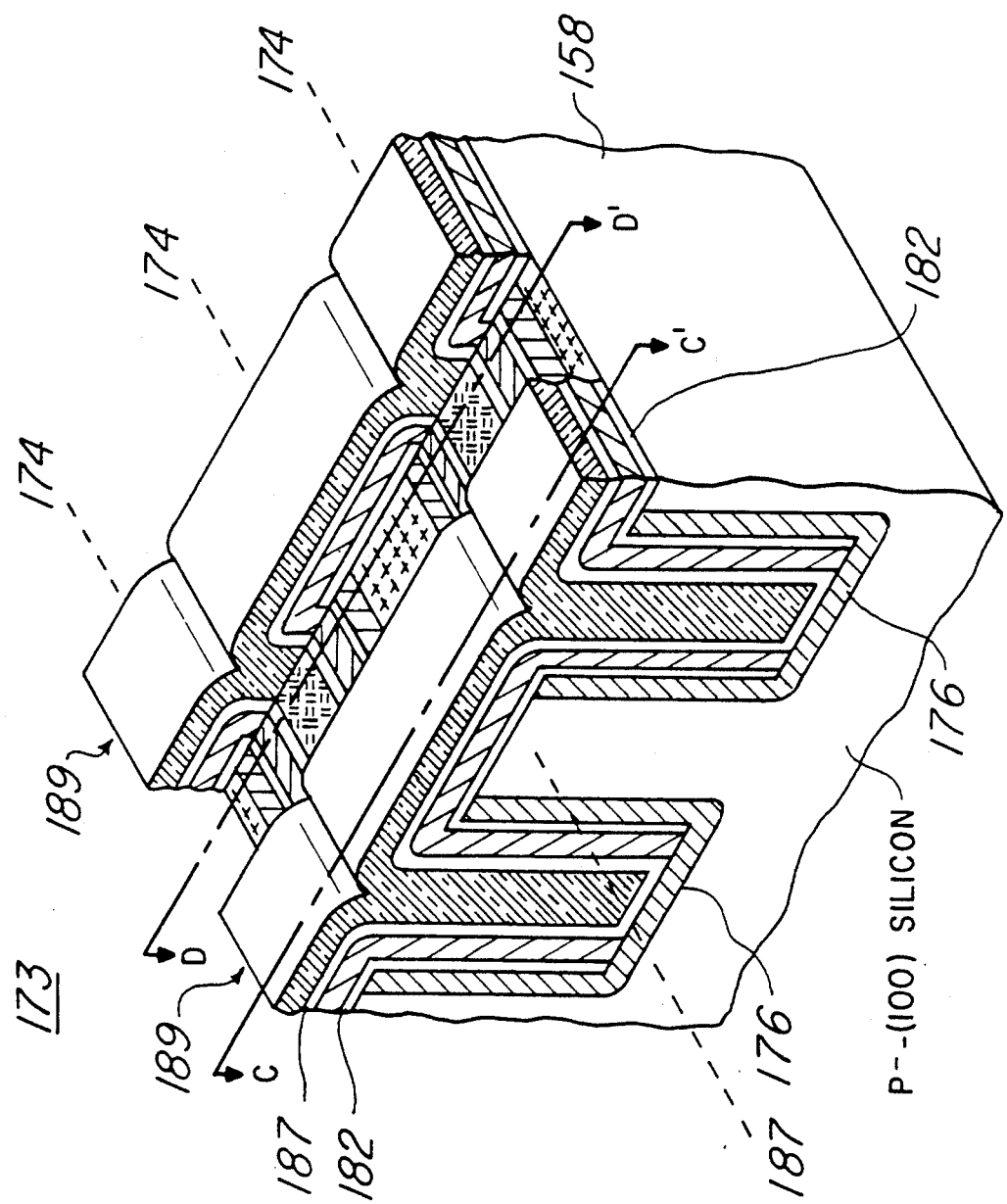
FIG. 9 is a cut-away partial perspective view of the device illustrated in FIG. 8.

As illustrated in FIG. 9, the control gates 186 are formed from continuous polysilicon layers which fill the trenches and function as row address lines 189 corresponding to lines 20 in the schematic illustration of FIG. 1. Thus the cells 150 in each row are interconnected. Adjacent address lines 189 may be isolated from one another by formation of vertical cuts 190 taken through the control gates 186 down to the substrate 158. Bit line isolation is enhanced by ion implantation to heavily p-dope the regions 192 lying between adjacent bit lines 176 and between adjacent address lines 189.

The process for fabricating the alternate embodiment of memory cells 150 is illustrated in FIGS. 10a–10e and FIGS. 11a-11e. With reference to lines C—C' and D—D' shown in FIG. 12, FIGS. 10 present, in a cross sectional view taken along line C—C', the fabrication sequence for an individual cell 150 formed between first and second trenches 152 and 154 while FIGS. 11 illustrate the fabrication sequence adjacent the cell 150 in a cross sectional view taken along line D—D'. The process may be directly applied to fabricate the device 173 comprising an array of cells 150 as illustrated in FIGS. 1, 9 and 12 wherein each trench extends along a column 174.

Figure 11A:
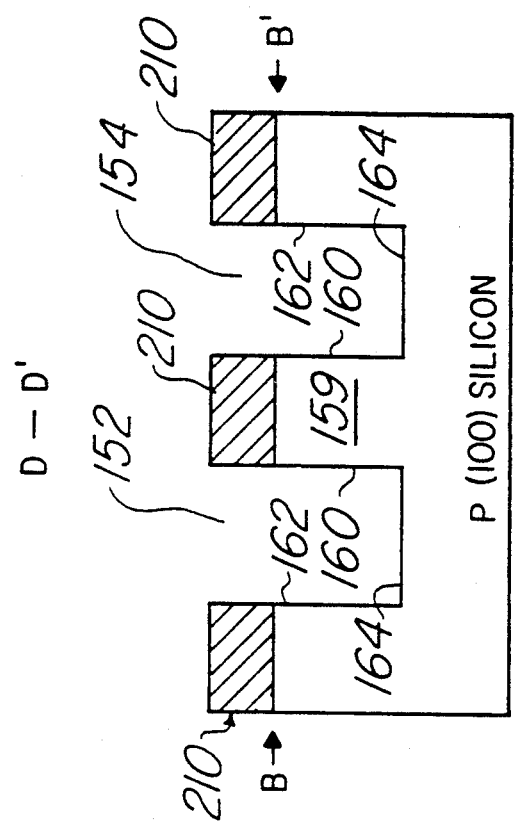
FIGS. 11 present, in a cross sectional view taken along line D—D' of FIGS. 9 and 12, the fabrication sequence for the device constructed according to the alternate embodiment of FIGS. 8 and 9.
Figure 11B:
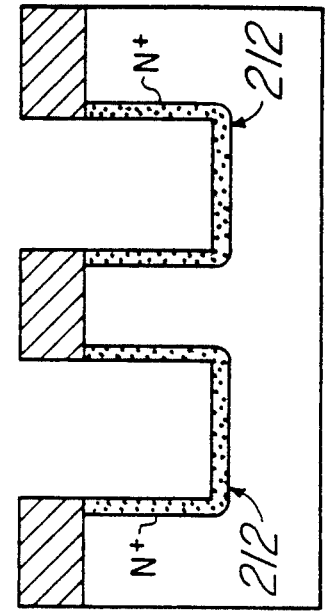
Figure 10A:
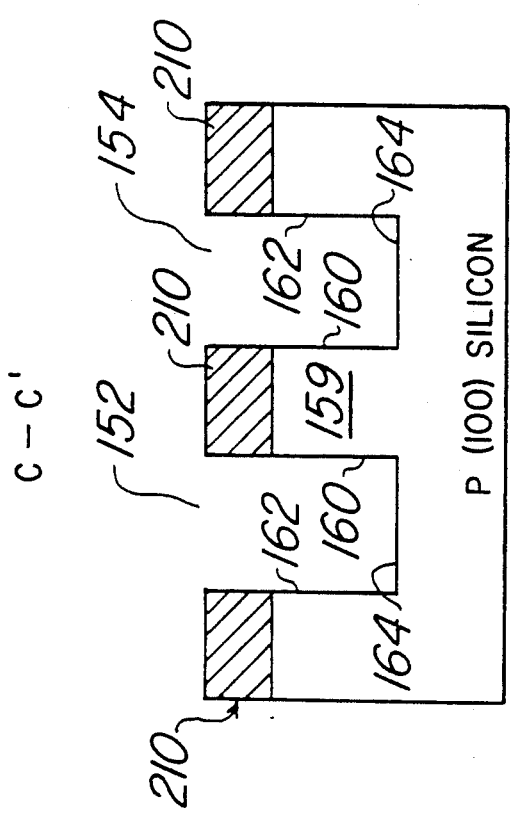
FIG. 10 present, in a cross sectional view taken along line C—C' of FIGS. 9 and 12, the fabrication sequence for the device constructed according to the alternate embodiment of FIGS. 8 and 9.
Figure 10B:
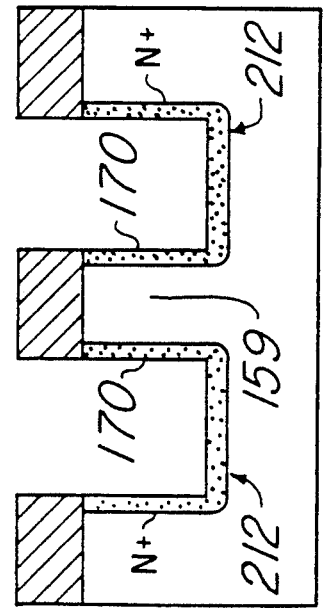
Figure 12:
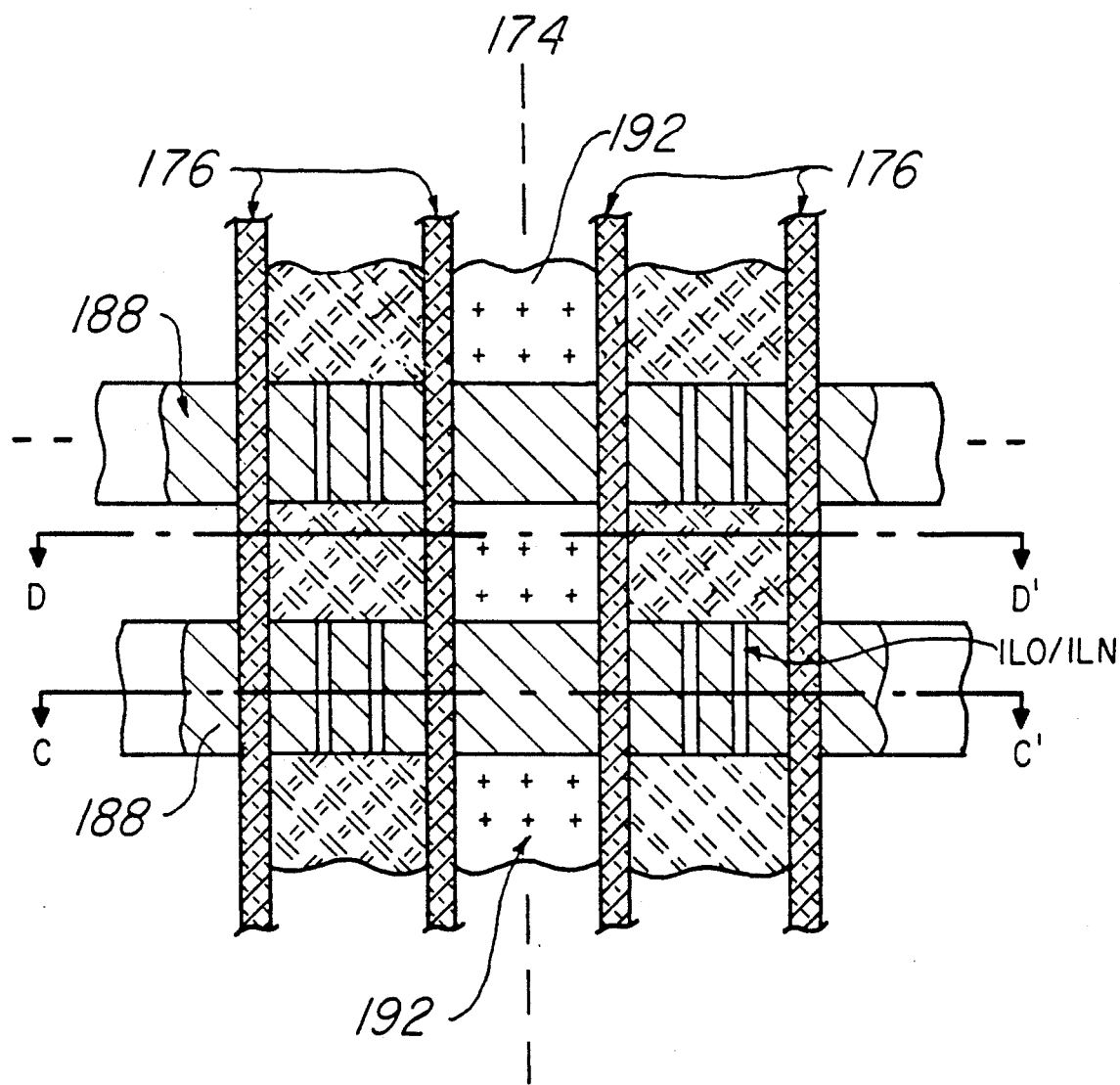
FIG. 12 is a cut-away partial plan view of the device illustrated in FIGS. 8 and 9.

As illustrated in FIGS. 10a and 11a, an oxide mask 210 is patterned over the substrate to define the first and second trenches 152 and 154 which are separated by the partition 159. The trenches are then formed with a silicon plasma etch. An n+ dopant is next deposited and diffused into the trench wall and bottom portions 160, 162 and 164 (FIGS. 10b and 11b).

Figure 11C:
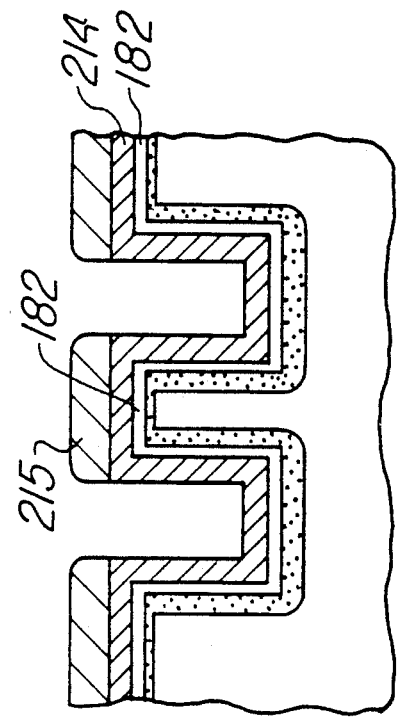
Figure 10C:
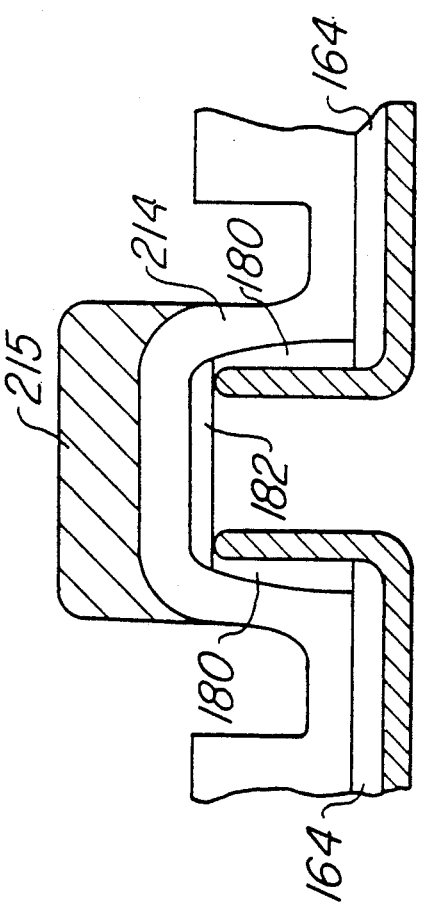

The oxide mask 210 is then stripped away and a high quality gate oxide 182 is thermally formed on the partition 159 (FIGS. 10c and 11c). Simultaneous oxidation along the surfaces of the doped source and drain electrodes 170 and 172 provides an insulative layer 180 to electrically isolate the floating gate 184 which is deposited in the following step.

Figure 11D:
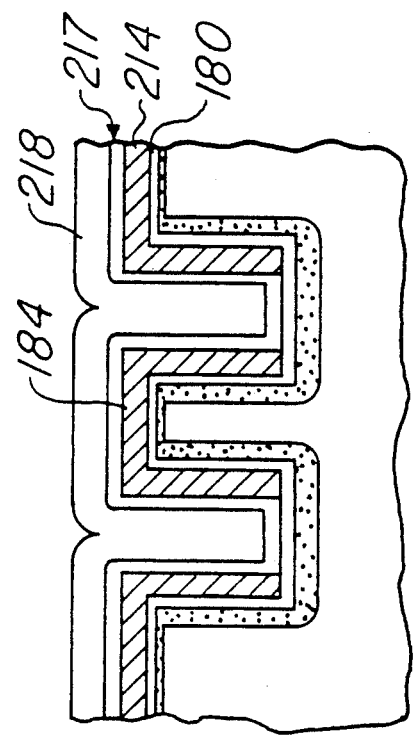
Figure 10D:
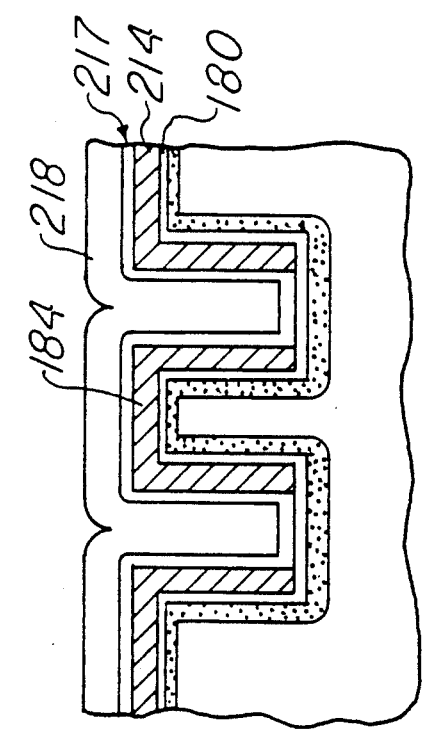

A fist layer 214 of doped polycrystalline semiconductor material is now formed about the partition substantially enveloping the electrodes. The portion of the polycrystalline layer 214 over the partition is next pattern blocked 215 and an anisotropic etch is applied to strip the first layer 214 from the trench bottom portions 164 along both lines C—C' and D—D'. The etching process result in the discrete formation of a folded floating gate 184 which is pleated about the substrate partition 159 (FIGS. 10d and 11d). The pattern block 215 is removed and an interlevel oxide/nitride dielectric layer 217 is deposited over the entire exposed surface.

Figure 11E:
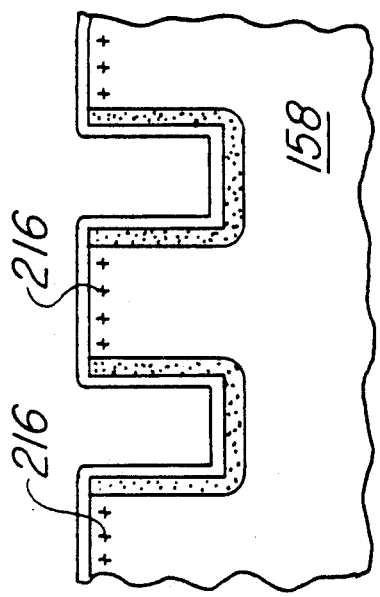
Figure 11F:
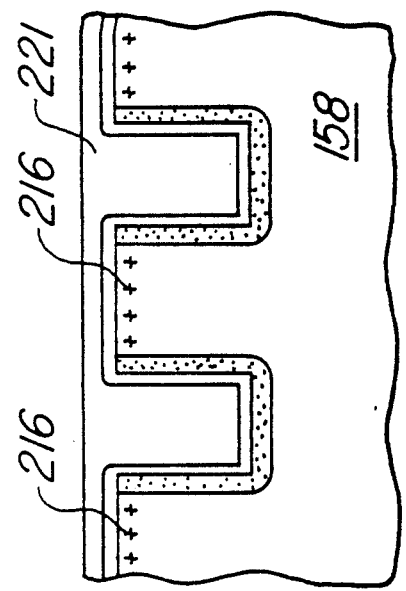
Figure 10E:
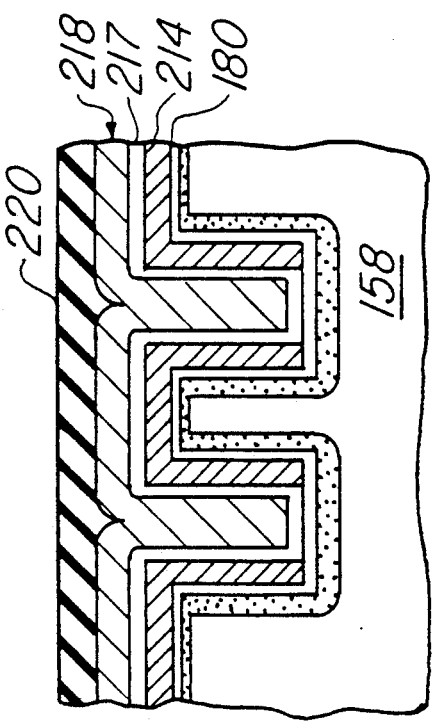
Figure 10F:
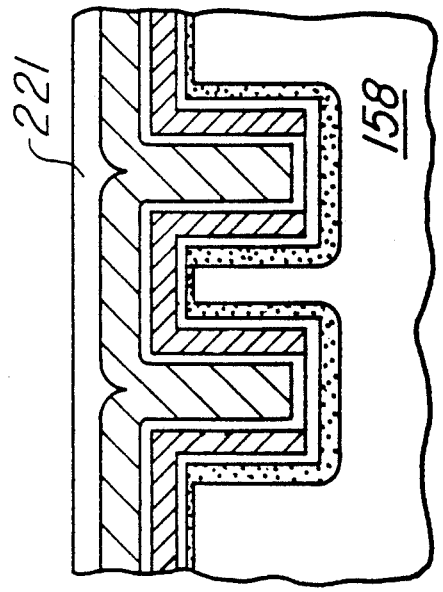

Next, a second polycrystalline layer 218 is deposited over the dielectric layer 217 (FIGS. 10d and 11d) and pattern blocked 220 along line C—C' only (FIGS. 10e and 11e). The surface is then subjected to a plasma etch to remove a strip of the second polycrystalline layer 218, the dielectric layer 217, and the first poly layer 214 along line D—D'. This results in the vertical cut 190 (FIG. 9) which isolates each cell 150 from cells in other rows. The remaining portion of the second polycrystalline layer 218, i.e., the control gate 186, completely fills the trench and covers the substrate surface along line C—C' to form part of a row address line 188 (FIG. 12.) Subsequently, with the pattern block in place, a p+ dopant is implanted in regions 192 along line D—D' to achieve bit line isolation (FIG. 11e). An oxide coating 221 is then applied to fill the cutaway region along line D—D', including the trenches, and to cover the row lines 188.

Having described the present invention in more than one embodiment other arrangements of the improved memory device comprising individual cells formed in or about trenches along a substrate surface will be apparent to those skilled in the art. Furthermore, although this disclosure teaches trenched bit lines as used in an EPROM cell, it is understood that this and other concepts disclosed herein can be applied to other technologies such as dynamic RAMs, PROMs, EEPROMs, etc. as well. Accordingly, the present invention is not limited to the embodiments herein described as examples, but can be subject to modifications within the scope of the claims which follow.

We claim:

1. A method for fabricating a memory device on a semiconductor structure, the device comprising an array of memory cells arranged in rows and columns along a first surface of the structure, each cell having a pleated floating gate, the method comprising the steps of:

forming first and second trenches along at least a first column and beneath the first surface, said trenches each having first and second wall portions and a bottom portion, the trenches separated by a partition extending along the first surface, the partition defining a first wall in the first trench and a second wall in the second trench;

depositing and diffusing a dose of dopant into the trenches in order to create a pair of bit lines along the first column, the bit lines including source and drain electrodes for each memory cell in the first column;

forming a first dielectric layer over the wall portions and the bottom portion of each trench;

forming a first conductive layer over the first dielectric layer and about the partition;

selectively removing portions of the first conductive layer to create a floating gate for each cell in the first column each floating gate having a pleat draped about the substrate partition;

forming a second dielectric layer over the floating gates in the first column; and forming a second conductive layer over the second dielectric layer to create a control gate over each floating gate in the first column.

2. The method of claim 1 wherein the step of forming the control gates includes selectively removing portions of the second conductive layer to pattern a control gate over each floating gate, the method further including the step of forming a plurality of row lines each row line electrically connected to a different control gate in the first column.

3. The method of claim 2 wherein the structure is of a first conductivity type and the step of forming the trenches is accomplished by patterning an oxide mask over the first surface and then applying an anisotropic etchant, the bit lines being formed with a dopant of a second conductivity type along both wall portions and the bottom portion of the trench.

4. The method of claim 3 further comprising the step of performing an implant of the first conductivity type after forming the word lines in order to isolate the bit lines from one another in regions of the structure lying between different rows of memory cells.

5. The method of claim 4 wherein the control gate is formed about the pleat shaped contour of the floating gate to enhance capacitive coupling.

6. The method of claim 5 wherein the structure is of a p-type conductivity, the method further comprising the step of performing a p-type implant after forming the word lines in order to isolate the bit lines from one another in regions of the structure lying between different rows of memory cells.

* * * * *